United States Patent [19]

Richardson

[11] Patent Number: 4,878,251

[45] Date of Patent: Oct. 31, 1989

[54] INTERFERENCE SIGNAL SUPPRESSOR FOR A RADIO RECEIVER

[75] Inventor: Christopher K. Richardson, Romsey, England

[73] Assignee: Plessey Overseas Limited, Ilford, England

[21] Appl. No.: 856,327

[22] Filed: Apr. 25, 1986

[30] Foreign Application Priority Data

Apr. 29, 1985 [GB] United Kingdom ............... 8510820

[51] Int. Cl.⁴ .......................................... H04B 1/16
[52] U.S. Cl. ................................. 455/206; 455/302; 455/304
[58] Field of Search ............... 455/205, 214, 303, 305, 455/311, 206–209, 302, 304, 306, 46, 47; 375/39, 77, 102

[56] References Cited

U.S. PATENT DOCUMENTS

| | | | |
|---|---|---|---|
| 2,654,885 | 10/1953 | Wilmotte | 455/206 |
| 2,744,247 | 5/1956 | Wilmotte | 455/206 |
| 3,092,776 | 6/1963 | Castellini | 455/206 |
| 3,287,645 | 11/1966 | Baghdady | 455/206 |
| 4,166,251 | 8/1979 | Ishigaki et al. | 455/205 |
| 4,397,039 | 8/1983 | McAuliffe | 455/203 |
| 4,651,107 | 3/1987 | Akaiwa | 455/214 |

FOREIGN PATENT DOCUMENTS

| | | | |
|---|---|---|---|
| 0012511 | 1/1979 | Japan | 455/205 |
| 0030242 | 3/1980 | Japan | 455/205 |

Primary Examiner—Robert L. Griffin
Assistant Examiner—Curtis Kuntz
Attorney, Agent, or Firm—Fleit, Jacobson, Cohn, Price, Holman & Stern

[57] ABSTRACT

An FM interference suppressor comprises two FM demodulators, one of which is fed with an input signal via an envelope detector and is arranged to feed a zero frequency detector and a phase inverter to produce a baseband composite signal comprising wanted and unwanted modulation. The other FM demodulator is fed directly with an input signal directly to produce a baseband signal comprising the unwanted modulation alone. A combiner is provided for subtractively combining the baseband signal and the baseband composite signal to produce the wanted modulation signal.

14 Claims, 2 Drawing Sheets

INTERFERENCE SIGNAL SUPPRESSOR FOR A RADIO RECEIVER

The present invention relates to improvements in or relating to interference suppressors for use in radio receivers and in particular, to apparatus for suppressing an unwanted FM signal having a signal strength greater than the signal strength of a wanted FM signal.

In an IF radio signal, a known technique for suppressing interference between a strong unwanted FM signal and a weaker wanted FM signal is to feed the IF signal to a conventional FM demodulator via an amplifier. The IF signal is also fed directly to a second conventional FM demodulator which is arranged to drive a variable tuned trap circuit. The second demodulator only responds to the stronger of the FM signals due to capture effect. The output voltage of the second demodulator is used to drive the trap circuit such that it follows the frequency of the stronger signal. The variable tuned trap circuit is connected to the input of the first demodulator where it is used to suppress the stronger signal. This technique is, however, very difficult to implement as the signal paths must be accurately matched both in level and time delay. Normally, only about 10 dB of suppression can be achieved.

The present invention seeks to provide improved apparatus for the reception of an FM signal in the presence of a relatively strong unwanted FM signal.

Accordingly, there is provided an interference suppressor for suppressing an unwanted FM signal having a signal strength greater than the signal strength of a wanted FM signal, the apparatus comprising a first demodulator for providing from the amplitude modulated beat signal produced by the interaction between the wanted and unwanted FM signals a composite baseband signal comprising the modulation of the wanted and the unwanted FM signals, a further demodulator arranged to receive the wanted and the unwanted FM signals and for providing a baseband signal corresponding to the modulation of the unwanted FM signal, and a combiner arranged to receive the composite baseband signal and the baseband signal for providing an output signal comprising the modulation of the wanted FM signal.

Preferably the apparatus comprises an envelope detector for providing the amplitude modulated beat signal for the first demodulator.

The first demodulator may comprise an instantaneous direct conversion frequency demodulator arranged to provide a signal having a voltage which is proportional to the instantaneous frequency of the amplitude modulated beat signal.

Furthermore, the apparatus may comprise a zero frequency detector and phase reverser coupled to the output of the first demodulator for reversing the phase of the output signal from the first demodulator when the nominal frequencies of the wanted and unwanted FM signals are closer than the FM deviation in the wanted and unwanted signals.

The present invention will now be described, by way of example, with reference to the accompanying drawings in which.

Figure 1:
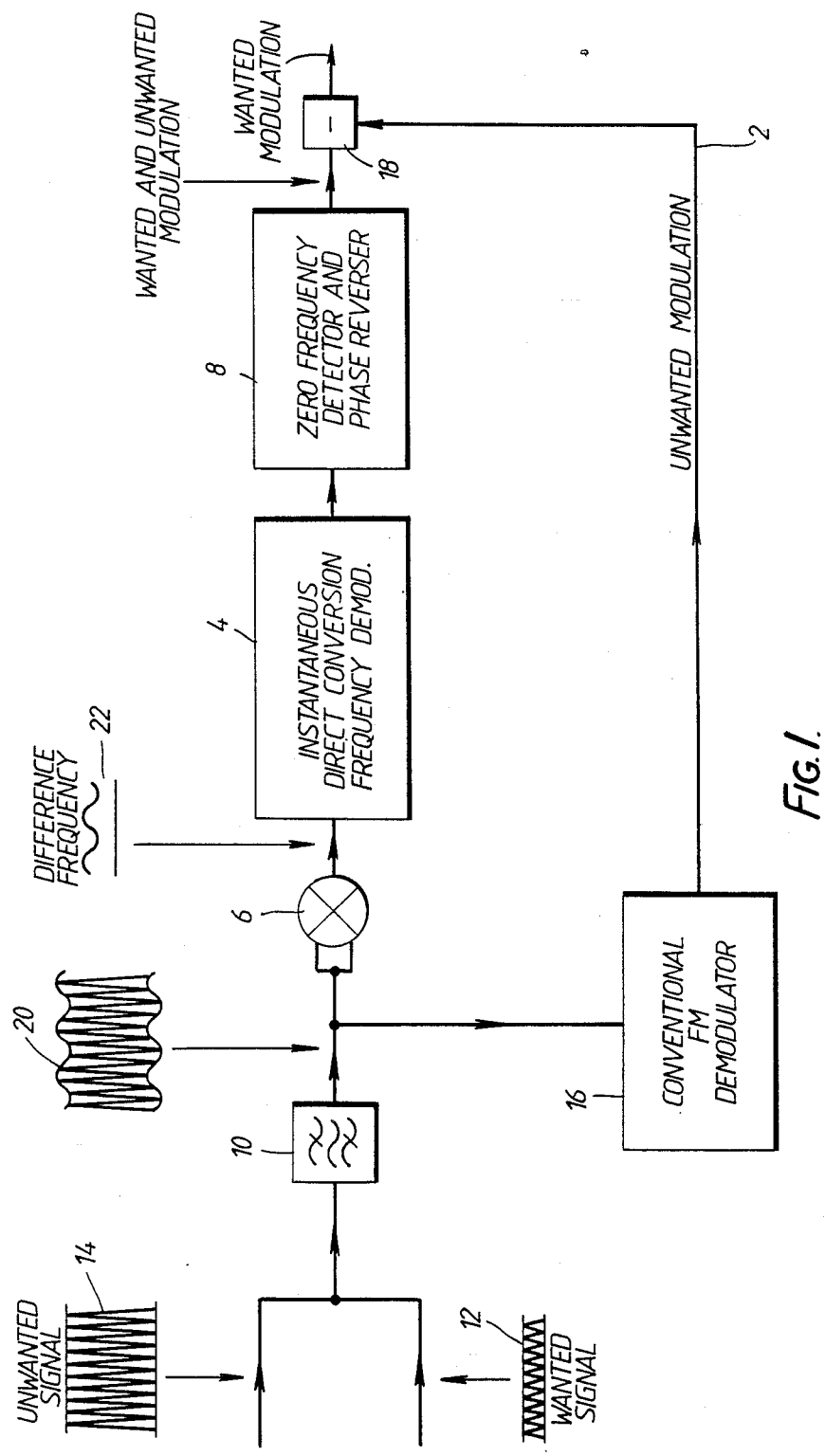
FIG. 1 illustrates a schematic block diagram of an interference suppressor according to the present invention.

Referring to FIG. 1, an interference suppressor 2 comprises a first demodulator 4, coupled between an envelope detector 6, such as a one port mixer, and a zero frequency detector and phase reverser 8. The envelope detector 6 is arranged to receive an IF signal, which may be derived from the IF port of a receiver, via a bandpass filter 10. The IF signal may comprise a wanted FM signal 12 and an unwanted FM signal 14, nominally on the same channel, the signal strength of the unwanted signal 14 being large relative to that of the wanted signal 12, as shown in FIG. 1. A further FM demodulator 16, such as a conventional limiter discriminator is coupled to the output of the bandpass filter 10. A combiner 18 is also provided, coupled to the output terminals of the demodulator 16 and the zero frequency detector and phase reverser 8.

The wanted signal 12 and unwanted signal 14 are fed via the bandpass filter 10 to the envelope detector 6 and FM demodulator 16. The signals 12 and 14 beat together at the instantaneous difference frequency between them to produce an AM signal 20. The frequency of the AM signal 20 is therefore derived from the frequency modulation on both of the FM signals 12 and 14. The envelope of the AM signal 12 is detected by the envelope detector 6 to provide the difference frequency signal 22. The amplitude of this waveform, after the DC component has been removed, is determined by the wanted signal 12 and is largely independent of the strength of the unwanted signal 14. The modulation components of the two signals contained in the difference frequency signal 22 are therefore normalised to the same level.

The signal 22 is fed to the demodulator 4 which is arranged to measure the slope and amplitude at all points on the waveform of the difference frequency signal 22 to derive an output signal the voltage of which is proportional to the instantaneous frequency of the signal 22. Therefore, the output signal from the demodulator 4 effectively contains the addition of the modulation waveforms of the wanted signal 12 and unwanted signal 14. However, if the nominal frequencies of the wanted and unwanted signals 12 and 14 are closer than the FM deviation in these signals, then the frequency spectrum of the two signals will cross. The crossing of the frequency spectrum produces an unwanted reversal in phase of the output waveform from the demodulator 4. This reversal in phase is compensated by the zero frequency detector and phase reverser 8 which detects when the frequency of the output signal of the demodulator 4 is zero (zero voltage) and simultaneously reverses the phase of the signal. The baseband composite output signal from the zero frequency detector and phase reverser 8 is therefore the modulation waveforms of the wanted and unwanted signals 12 and 14.

The wanted and unwanted FM signals are also fed to the conventional FM demodulator 16. Capture effect in the demodulator 16 suppresses the weaker signal 12 and hence the baseband output signal from the demodulator 16 comprises the modulation waveform of the unwanted signal 14. The output signals from the zero frequency detector and phase reverser 8 and the demodulator 16 are subtractively combined in the combiner 18 whereby the modulation from the unwanted signal 14 is cancelled to leave the modulation waveform from the wanted signal 12.

Figure 2:
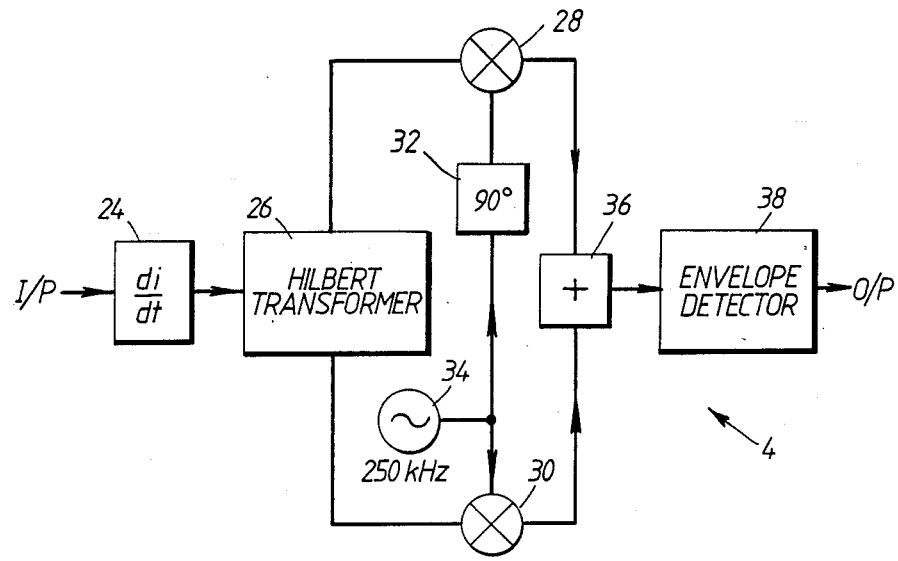
FIG. 2 illustrates a schematic block diagram of an instantaneous direct conversion frequency demodulator for use in the interference suppressor shown in FIG. 1.

The demodulator 4 comprises an instantaneous direct conversion frequency demodulator, as shown in FIG. 2. The demodulator 4 comprises a differentiator circuit 24 coupled to a Hilbert transformer 26. The outputs of the Hilbert transformer are coupled to a conventional phasing type single side band (SSB) generator consisting of a pair of mixers 28, 30, arranged for operation in phase quadrature be means of a phase shifter 32 from an RF source 34, such as a 250 kHz oscillator. The outputs of the mixers 28, 30 are coupled via a combiner 36 to an envelope detector 38, which may comprise a single port mixer.

The level of the output signal of the differentiator circuit 24 is dependent on the frequency of the input signal to the demodulator 4. The output signal from the differentiator circuit 24 is split into quadrature components by the Hilbert transformer 26. The quadrature components are fed to the mixers 28, 30 which also receive clock signals in phase quadrature from the 250 kHz RF source 34. The output signals from the mixers 28, 30 are fed to the combiner 36. The output signal of the combiner 36 comprises therefore, of a carrier signal at 250 kHz with a single side band offset by the frequency F of the input signal to the differentiator circuit 24. If the frequency F of the input signal is relatively low, say 1 kHz, the SSB generator acts to translate this low frequency signal up to a frequency of 251 kHz. This translation occurs because the amplitude of the output signal of the SSB generator follows the amplitude of the output signal of the differentiator circuit 24 which is proportional to the frequency of the input signal F. The output signal from the combiner 36 is envelope detected by the envelope detector 38, thereby producing the required output signal from a relatively low frequency input signal.

Figure 3:
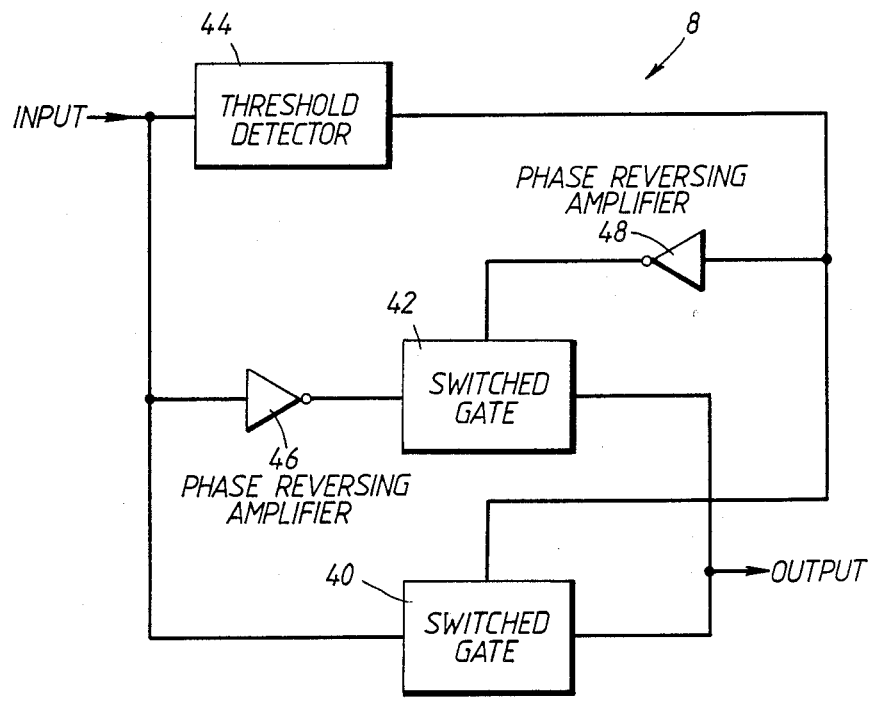
FIG. 3 illustrates a schematic block diagram of a zero frequency detector and phase reverser for use in the interference suppressor shown in FIG. 1.

As previously stated, the interference suppressor 2 includes a zero frequency detector and phase reverser 8 to compensate for any unwanted reversal in the phase of the output signal from the demodulator 4. The zero frequency detector and phase reverser 8 comprises a pair of switched gate circuits 40, 42, as shown in FIG. 3. The gate circuit 40 has a first input for receiving directly the output signal from the demodulator 4 and a second input for receiving the output signal from the demodulator 4 via a threshold detector 44. The switched gate circuit 42 has a first input for receiving the output from the demodulator 4 via a phase reversing amplifier and a second input coupled to the threshold detector 44 via a further phase reversing amplifier 48. The threshold detector 44 is arranged to operate so that when the output signal from the demodulator 4 is at or near zero, indicating zero frequency in the demodulated signal and hence a cross in the spectra of the wanted and unwanted signals, one or other of the switched gate circuits 40, 42 is actuated to provide a phase inverted output signal as required.

The interference suppressor described above may be fabricated as an applique unit or it may be fitted as an internal module to existing radio receivers. In practice, an interference suppressor as described above has been shown to work satisfactorily at a power ratio of 100 dB between the wanted and unwanted FM signals.

Although the present invention has been described with respect to a particular embodiment, it should be understood that modification may be effected whilst remaining within the scope of the invention.

I claim:
1. An interference suppressor and demodulation unit for a radio receiver for suppressing an unwanted FM signal having a signal strength greater than the signal strength of a wanted FM signal, each FM signal having a respective frequency, the suppressor comprising means for providing an amplitude modulated beat signal from the wanted and unwanted FM signals, said means being coupled to a means for providing a difference frequency signal in dependence upon the amplitude modulated beat signal, a first demodulator arranged to receive the difference frequency signal and apply this through a zero frequency detector and phase reverser to provide a composite baseband signal comprising a modulation of the wanted and unwanted FM signals, a further demodulator arranged to receive the amplitude modulated beat signal, for providing a baseband signal corresponding to the modulation of the unwanted FM signal, and a combiner coupled to the first demodulator and said further demodulator, the combiner being arranged to receive the composite baseband signal and the baseband signal for providing an output signal comprising the modulation of the wanted FM signal and in which the unwanted signal has been suppressed.

2. An interference suppressor according to claim 1 wherein the means for providing the amplitude modulated beat signal comprises a bandpass filter.

3. An interference suppressor according to claim 1 wherein the difference frequency signal has an instantaneous frequency and the first demodulator comprises an instantaneous direct conversion frequency demodulator arranged to provide an output signal having a voltage which is proportional to the instantaneous frequency of the difference frequency signal.

4. An interference suppressor according to claim 3, wherein the instantaneous direct conversion frequency demodulator comprises a differentiator circuit arranged to receive the amplitude modulated beat signal coupled to a Hilbert transformer, the Hilbert transformer being coupled to two mixers, a clock pulse source coupled to the two mixers thereby enabling the mixers to operate in phase quadrature and a combiner coupled to the mixers for combining the output signals from the two mixers and an envelope detector coupled to the combiner.

5. An interference suppressor according to claim 3 comprising a zero frequency detector and phase reverser coupled to the first demodulator for reversing the phase of the output signal from the first demodulator when the respective frequencies of the wanted and unwanted FM signals are closer than a FM deviation in the wanted and unwanted signals.

6. An interference suppressor according to claim 5 wherein the zero frequency detector and phase reverser comprises a first switched gate circuit having a first input for receiving the output signal from the first demodulator and a second input for receiving the output signal from the first demodulator via a threshold detector, and a second switched gate circuit having a first input for receiving the output signal from the first demodulator via a phase reversing amplifier and a second input for receiving the output signal from the first demodulator via the threshold detector and a further phase reversing amplifier.

7. An interference suppressor according to claim 1 wherein the further demodulator comprises a limiter discriminator.

8. A interference suppressor according to claim 1, wherein the means for providing a difference frequency signal comprises an envelope detector.

9. An interference suppressor according to claim 8 wherein the envelope detector for providing the difference frequency signal for the first demodulator comprises a single port mixer.

10. An interference suppressor and demodulator unit for a radio receiver, the unit having means for suppressing an unwanted FM signal having a signal strength greater than the signal strength of a wanted FM signal, the unit comprising a bandpass filter for providing an amplitude modulated beat signal from the wanted and unwanted FM signals, an envelope detector coupled to said filter and arranged to produce a difference frequency signal dependent upon said beat signal, a first demodulator arranged to provide an output signal containing an addition of the modulation waveforms of the wanted and unwanted signals, a zero frequency detector and phase reverser providing modulation waveforms of the wanted and unwanted signals, and a combiner having a first input terminal connected to receive said modulation waveforms, the combiner additionally having a second input terminal which is connected to a second demodulator to which the amplitude modulated beat signal is applied, the combiner providing a signal at an output terminal which comprises the modulation part of the wanted FM signal and in which the unwanted signal has been suppressed.

11. An interference suppressor unit according to claim 10, in which said first demodulator is an instantaneous direct conversion frequency demodulator arranged to provide an output signal having a voltage which is proportional to the instantaneous frequency of the amplitude modulated beat signal.

12. An interference suppressor unit according to claim 11, in which the frequency demodulator comprises a differentiator circuit coupled to a Hilbert transformer, said transformer having output leads which are coupled to a phasing type single side band generator, said generator comprising a pair of mixers which are arranged for operation in phase quadrature by means of a phase shifter and signals from a RF clock pulse source, and the mixers having output leads which are coupled to a combiner, in which an output lead from said combiner is connected to an envelope detector, an output from said envelope detector then serving as an output terminal of the resulting frequency demodulator circuit.

13. An interference suppressor and demodulator unit for a radio receiver, the unit having means for suppressing an unwanted FM signal having a signal strength greater than the signal strength of a wanted FM signal, the unit comprising a bandpass filter for providing an amplitude modulated beat signal from the wanted and unwanted FM signals, an envelope detector coupled to said filter and arranged to produce a difference frequency signal dependent upon said beat signal, a first demodulator comprising an instantaneous direct conversion frequency demodulator arranged to provide an output signal having a voltage which is proportional to the instantaneous frequency of the amplitude modulated beat signal, a zero frequency detector and phase reverser comprising a first switched gate circuit having a first input for receiving the output signal from the first demodulator and a second input for receiving the output signal from the first demodulator via a threshold detector, and a second switched gate circuit having a first input for receiving the output signal from the first demodulator via a phase reversing amplifier and a second input for receiving the output signal from the first demodulator via the threshold detector and a further phase reversing amplifier thus providing modulation waveforms of the wanted and unwanted signals, and a combiner having a first input terminal connected to receive said modulation waveforms, the combiner additionally having a second input terminal which is connected to a second demodulator to which the amplitude modulated beat signal is applied, the combiner providing a signal at an output terminal which comprises the modulation part of the wanted FM signal and in which the unwanted signal has been suppressed.

14. An interference suppressor and demodulator unit for a radio receiver, the unit having means for suppressing an unwanted FM signal having a signal strength greater than the signal strength of a wanted FM signal, the unit comprising a bandpass filter for providing an amplitude modulated beat signal from the wanted and unwanted FM signals, an envelope detector coupled to said filter and arranged to produce a difference frequency signal dependent upon said beat signal, a first demodulator comprising an instantaneous direct conversion frequency demodulator which comprises a differentiator circuit coupled to a Hilbert transformer, said transformer having output leads which are coupled to a phasing type single sideband generator, said generator comprising a pair of mixers which are arranged for operation in phase quadrature by means of a phase shifter and signals from a RF clock pulse source, and the said mixers having output leads which are coupled to a combiner, in which an output lead from said combiner is connected to an envelope detector, an output from said envelope detector then serving as an output terminal of the resulting frequency demodulator circuit, a zero frequency detector and phase reverser comprising a first switched gate circuit having a first input for receiving the output signal from the first demodulator and a second input for receiving the output signal from the first demodulator via a threshold detector, and a second switched gate circuit having a first input for receiving the output signal from the first demodulator via a phase reversing amplifier and a second input for receiving the output signal from the first demodulator via the threshold detector and a further phase reversing amplifier thus providing modulation waveforms of the wanted and unwanted signals, and a combiner having a first input terminal connected to receive said modulation waveforms, the combiner additionally having a second input terminal which is connected to a second demodulator to which the said amplitude modulated beat signal is applied, combiner providing a signal at an output terminal which comprises the modulation part of the wanted FM signal and in which the unwanted signal has been suppressed.

* * * * *